(12) United States Patent
Yang et al.

(10) Patent No.: US 7,169,680 B2
(45) Date of Patent: Jan. 30, 2007

(54) METHOD FOR FABRICATING A METAL-INSULATOR-METAL CAPACITOR

(75) Inventors: Jinsheng Yang, Hsin-Chu (TW); Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 9 days.

(21) Appl. No.: 10/906,538

(22) Filed: Feb. 24, 2005

(65) Prior Publication Data

US 2006/0189090 A1 Aug. 24, 2006

(51) Int. Cl.
*H01L 21/4763* (2006.01)
(52) U.S. Cl. .............. 438/396; 438/387; 438/675; 438/637; 257/534; 257/E21.477
(58) Field of Classification Search ............... 257/534, 257/E21.477; 438/396, 387, 675, 637
See application file for complete search history.

(56) References Cited

U.S. PATENT DOCUMENTS

| 6,329,234 B1 * | 12/2001 | Ma et al. ................ 438/210 |
|---|---|---|
| 6,346,454 B1 * | 2/2002 | Sung et al. ............... 438/396 |
| 6,429,118 B1 * | 8/2002 | Chen et al. ............... 438/629 |
| 6,436,787 B1 * | 8/2002 | Shih et al. ............... 438/396 |
| 6,723,600 B2 * | 4/2004 | Wong et al. .............. 438/244 |
| 6,794,262 B2 * | 9/2004 | Ning et al. ............... 438/396 |
| 2001/0019144 A1 * | 9/2001 | Roy ......................... 257/296 |
| 2002/0155676 A1 * | 10/2002 | Stetter et al. ............ 438/396 |
| 2004/0224474 A1 * | 11/2004 | Barth et al. .............. 438/396 |
| 2005/0233519 A1 * | 10/2005 | Change et al. .......... 438/253 |

* cited by examiner

*Primary Examiner*—Bradley K. Smith
*Assistant Examiner*—Steven J. Fulk
(74) *Attorney, Agent, or Firm*—Winston Hsu (57) ABSTRACT

A method for fabricating a capacitor is disclosed. First, a dielectric layer is disposed on a semiconductor substrate. Next, at least one dual damascene opening and at least one capacitor opening are formed in the dielectric layer. Next, a first conductive layer is disposed on the surface of the dielectric layer, the bottom and sidewall of the capacitor opening, and the dual damascene opening. Next, an insulating layer is formed on the first conductive layer and a second conductive layer is disposed on the insulating layer. Following that, a planarization process is performed to remove the second conductive layer, the insulating layer, and the first conductive layer on the dielectric surface for forming a capacitor and a dual damascene conductor.

17 Claims, 7 Drawing Sheets

Fig. 7

METHOD FOR FABRICATING A METAL-INSULATOR-METAL CAPACITOR

BACKGROUND OF INVENTION

1. Field of the Invention

The present invention relates to a method for fabricating a capacitor, and more particularly, to a method for fabricating a metal-insulator-metal capacitor.

2. Description of the Prior Art

In semiconductor manufacturing processes, metal capacitors formed of metal-insulator-metal (MIM) are widely used in the design of ultra large scale integrations (ULSI). Because a MIM capacitor has low resistance and low parasitic capacitance, and has no problems in shifts of depletion induced voltage, MIM capacitors have become the main structure used for metal capacitors. It is therefore important to develop a MIM capacitor that comprises copper electrodes with low resistance.

Figure 1:
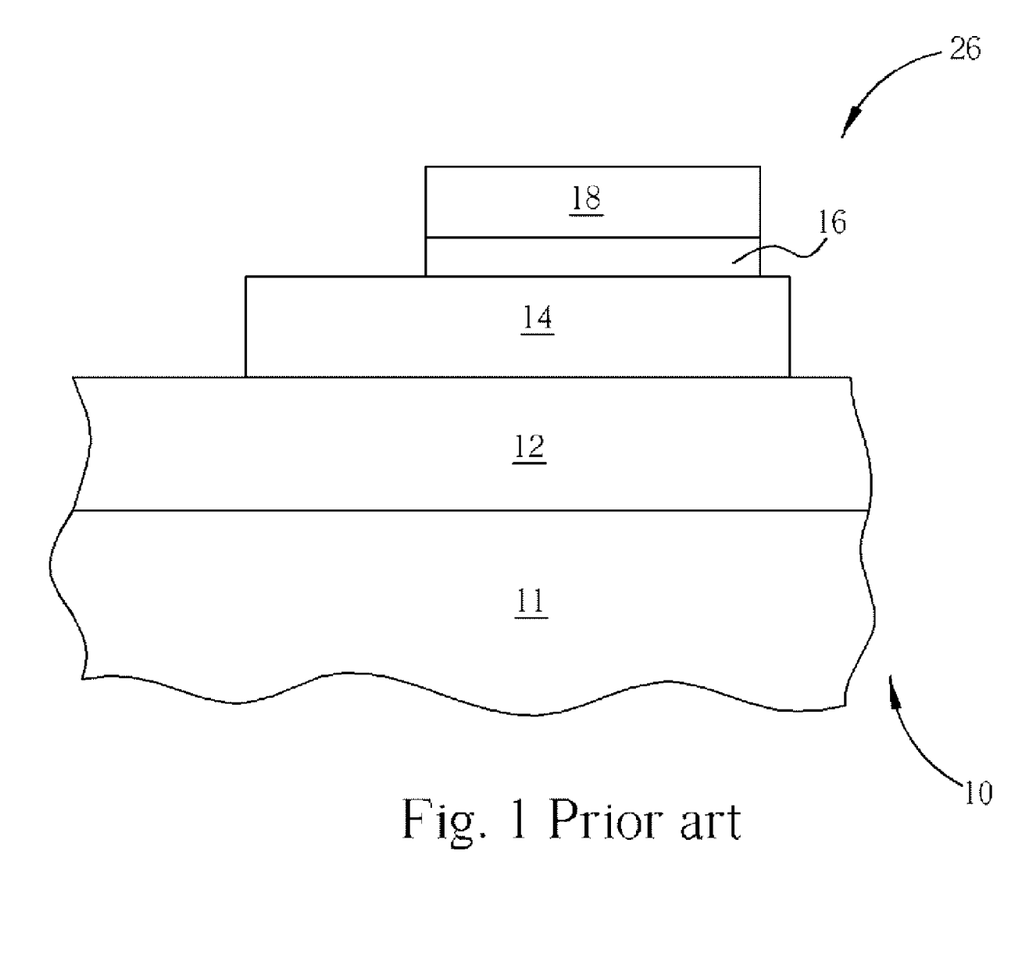
FIG. 1 and FIG. 2 are perspective diagrams showing a method for fabricating a metal capacitor according to the prior art.
Figure 2:
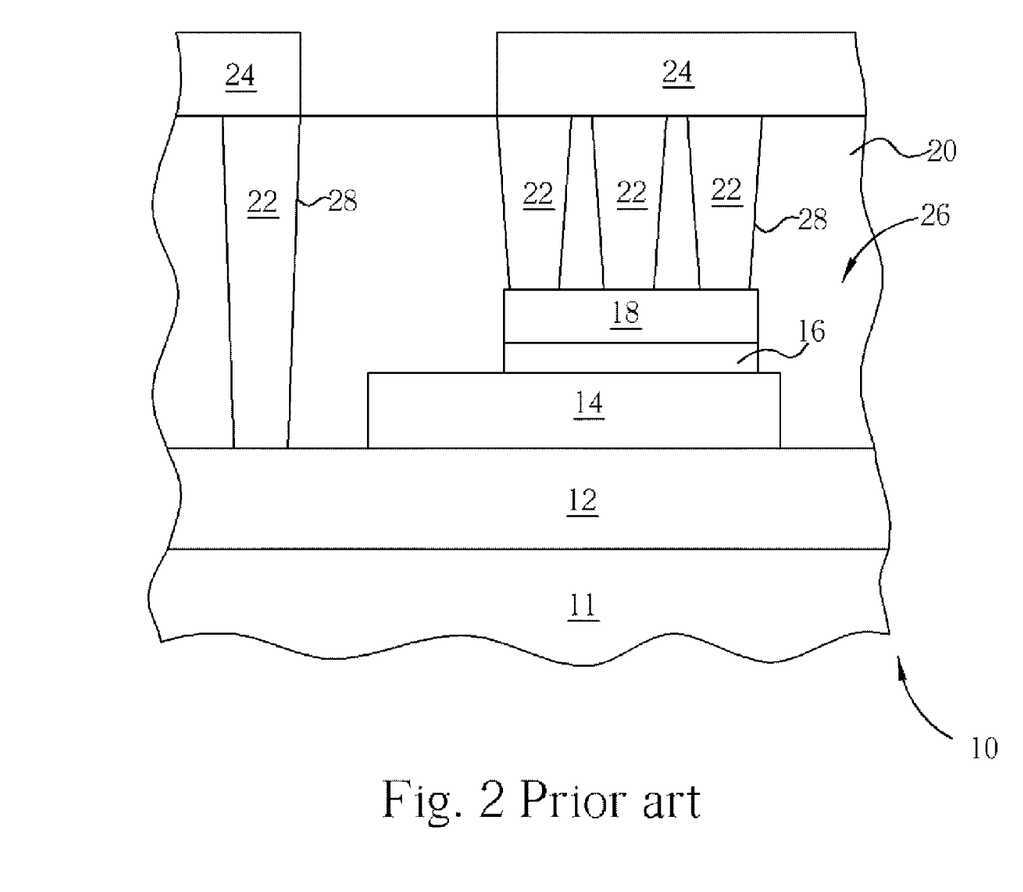

Please refer to FIG. 1 and FIG. 2. FIG. 1 and FIG. 2 are schematic views of forming a metal capacitor 26 on a semiconductor wafer 10 according to the prior art. As shown in FIG. 1, the semiconductor wafer 10 includes a substrate 11, and a dielectric layer 12 positioned on the substrate 11. In the prior art method, a metal bottom plate 14, composed of an aluminum layer, is evenly formed on the surface of the dielectric layer 12. An insulation layer and another metal layer are then respectively deposited on the surface of the metal bottom plate 14. A lithographic process is performed to define the patterns of a metal upper plate 18, and the excess portions of metal layer and insulation layer are removed to form the inter-metal insulator (IMI) 16 and the metal upper plate 18 so as to finish the formation of the metal capacitor 26.

As shown in FIG. 2, an inter-metal dielectric (IMD) layer 20 covers the metal capacitor 26, and a chemical mechanical polishing (CMP) process is used to planarize the surface of the inter-metal dielectric layer 20. A photoresist layer (not shown) is coated on the surface of the inter-metal dielectric layer 20, and a lithographic process is performed to define the position of via holes 28. The excess portions of the photoresist layer are then removed, and a dry etching process is performed, using the residual photoresist layer as a mask. The inter-metal dielectric layer 20 that is not covered by the mask is removed so as to form the via holes 28. The residual photoresist layer is then stripped.

A sputtering process is performed to form a metal layer (not shown) that fills the via holes 28. Either an etching back process or a chemical mechanical polishing (CMP) process is then performed to remove portions of the metal layer, so as to make a surface of the metal layer in the via holes 28 aligned with a surface of the inter-metal dielectric layer 20, forming the via plugs 22. A metal layer (not shown) is then evenly deposited on the surface of the inter-metal dielectric layer 20, and an etching process is performed to form a metal wire 24 on top of the via plugs 22. The via plugs 22 are used to electrically connect the metal wire 24 and the metal capacitor 26.

With the increasing complexity of integrated circuits, the multilevel interconnect process has become the typical method used in semiconductor integrated circuit fabrication. To satisfy the requirements for high integration and high speed in integrated circuits (ICs), especially in a deep sub-micro (<0.18 µm) semiconductor process, a copper (Cu) dual damascene process is becoming more widely used as a standard process in forming an interconnection line within the inter-metal dielectric layer of low dielectric constant (low k) materials. Since copper has both a low resistance and a low electromigration resistance, the low k materials are useful in improving the RC delay effect of a metal interconnection. Consequently, how to integrate copper fabrication processes to fabricate MIM capacitors and internal metal wires with low resistance has become a key research topic in this field.

SUMMARY OF INVENTION

It is therefore a primary objective of the present invention to provide a method by utilizing a copper dual damascene structure to fabricate an MIM capacitor for improving the overall performance and metal effect between the capacitor and metal wires.

According to the present invention, a method for fabricating a capacitor is disclosed. First, a dielectric layer is disposed on a semiconductor substrate. Next, at least one dual damascene opening and at least one capacitor opening are formed in the dielectric layer. Next, a first conductive layer is disposed on the surface of the dielectric layer, the bottom and sidewall of the capacitor opening, and the dual damascene opening. Next, an insulating layer is formed on the first conductive layer and a second conductive layer is disposed on the insulating layer. Following that, a planarization process is performed to remove the second conductive layer on the surface of the dielectric layer, the insulating layer, and the first conductive layer for forming a capacitor in the capacitor opening and a dual damascene conductor in the dual damascene opening.

By utilizing a copper dual damascene process to fabricate the MIM capacitor, the present invention provides an improved method that is capable of reducing the integration barrier and contact resistance between the capacitor and metal wires and also improving the overall performance.

These and other objectives of the present invention will no doubt become obvious to those of ordinary skill in the art after reading the following detailed description of the preferred embodiment that is illustrated in the various figures and drawings.

DETAILED DESCRIPTION

Please refer to FIG. 3 to FIG. 7. FIG. 3 to FIG. 7 are perspective diagrams showing a method for fabricating an MIM capacitor according to the present invention.

Figure 3:
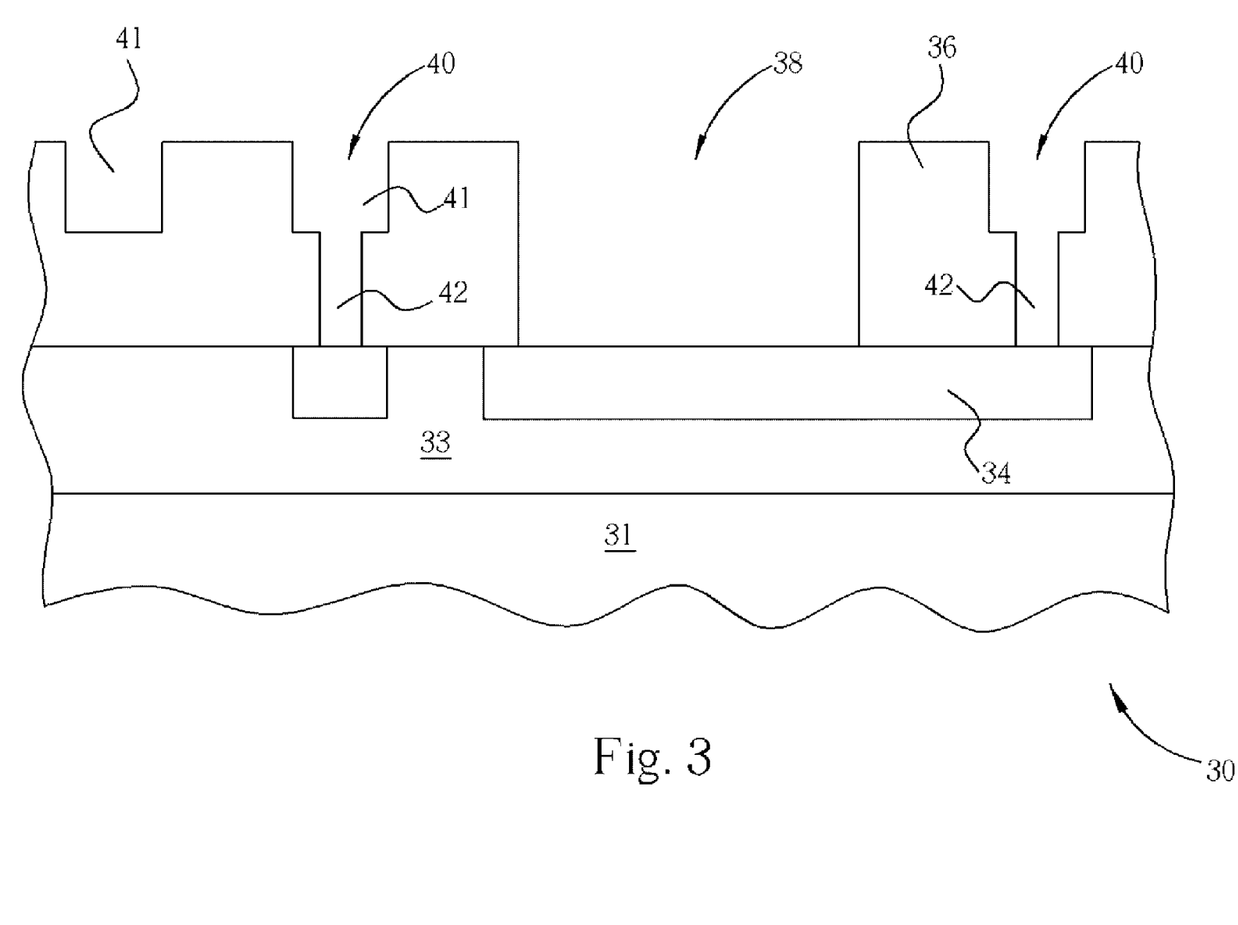
FIG. 3 to FIG. 7 are perspective diagrams showing a method for fabricating an MIM capacitor according to the present invention.

As shown in FIG. 3, a substrate 31 is included on the surface of a semiconductor die 30, in which a dielectric layer 33 is disposed on the substrate 31. In addition, a metal interconnect 34 fabricated by a dual damascene process is included in between the substrate 31 and the dielectric layer 33 for electrically connecting the capacitor, the dual damascene conductor, and other devices formed on the semiconductor die 30 formed afterwards. Next, at least one dual damascene opening 40 and at least one capacitor opening 38 are formed inside another dielectric layer 36. It should be noted that the traditional method of fabricating a dual damascene generally includes following different types of processes: (a) a via-first fabrication; (b) a self-aligned fabrication; and (c) a trench-first fabrication. For instance, a first photoresistance pattern (not shown) is formed on the dielectric layer 36 for defining the upper trench pattern and the dual damascene pattern of a dual damascene structure. Next, an anisotropic etching process is performed to etch a trench 41 and a partial formation of the dual damascene opening 40 in the dielectric layer 36. Next, a second photoresistance pattern (not shown) is formed on the trench 41 for defining a via 42 in the trench 41 and finally etching the via 42 to the surface of the metal interconnect 34. Alternatively, the dual damascene opening 40 can also be formed by first disposing a first photoresistance layer (not shown) on the dielectric layer 36 for defining and etching the via 42. Then a second photoresistance layer (not shown) is disposed on the dielectric layer 36 for defining a trench 41 and etching the trench 41 to the center of the dielectric layer 36 and etching the via 42 to the surface of the metal interconnect 34.

Figure 4:
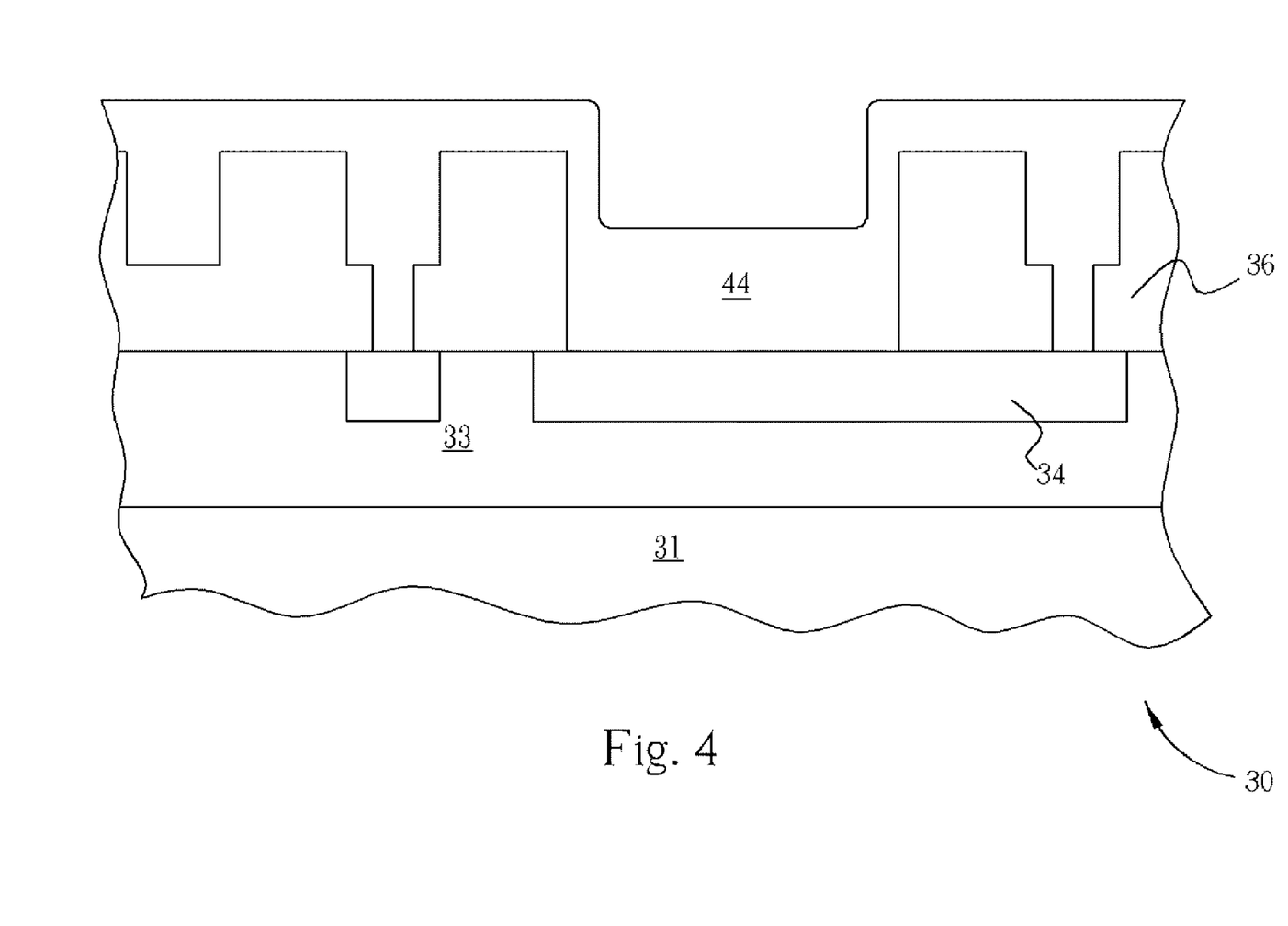

As shown in FIG. 4, a first conductive layer 44 is disposed on the dielectric layer 36, the sidewall and bottom of the capacitor opening 38, and the entire dual damascene opening 40, in which the first conductive layer 44 that covers the capacitor opening 38 is the bottom plate of the MIM capacitor of present invention, and the thickness of the first conductive layer 44 covering the bottom of the capacitor opening 38 is smaller than the thickness of the dielectric layer.

According to the preferred embodiment of the present invention, the first conductive layer 44 is a copper layer. Hence before the first conductive layer 44 is formed, a barrier layer (not shown) can be disposed on the surface of the dielectric layer 36, the sidewall and bottom of the capacitor opening 38, and the dual damascene opening 40 for preventing the copper ion migration from the copper layer to the dielectric layer 36. The barrier layer can be comprised of different combinations from tantalum (Ta), tantalum nitride (TaN), titanium (Ti), and titanium nitride. Next, a seed layer (not shown) is disposed on the barrier layer for enhancing the attaching ability of the copper ion of the copper layer on the dielectric layer 36. In most cases, both the barrier layer and the seed layer are formed by a chemical vapor deposition (CVD) process. Finally, a copper layer is disposed on the surface of the dielectric layer 36, the sidewall and bottom of the capacitor opening 38, and dual damascene opening 40 by a electroplating process.

Figure 5:
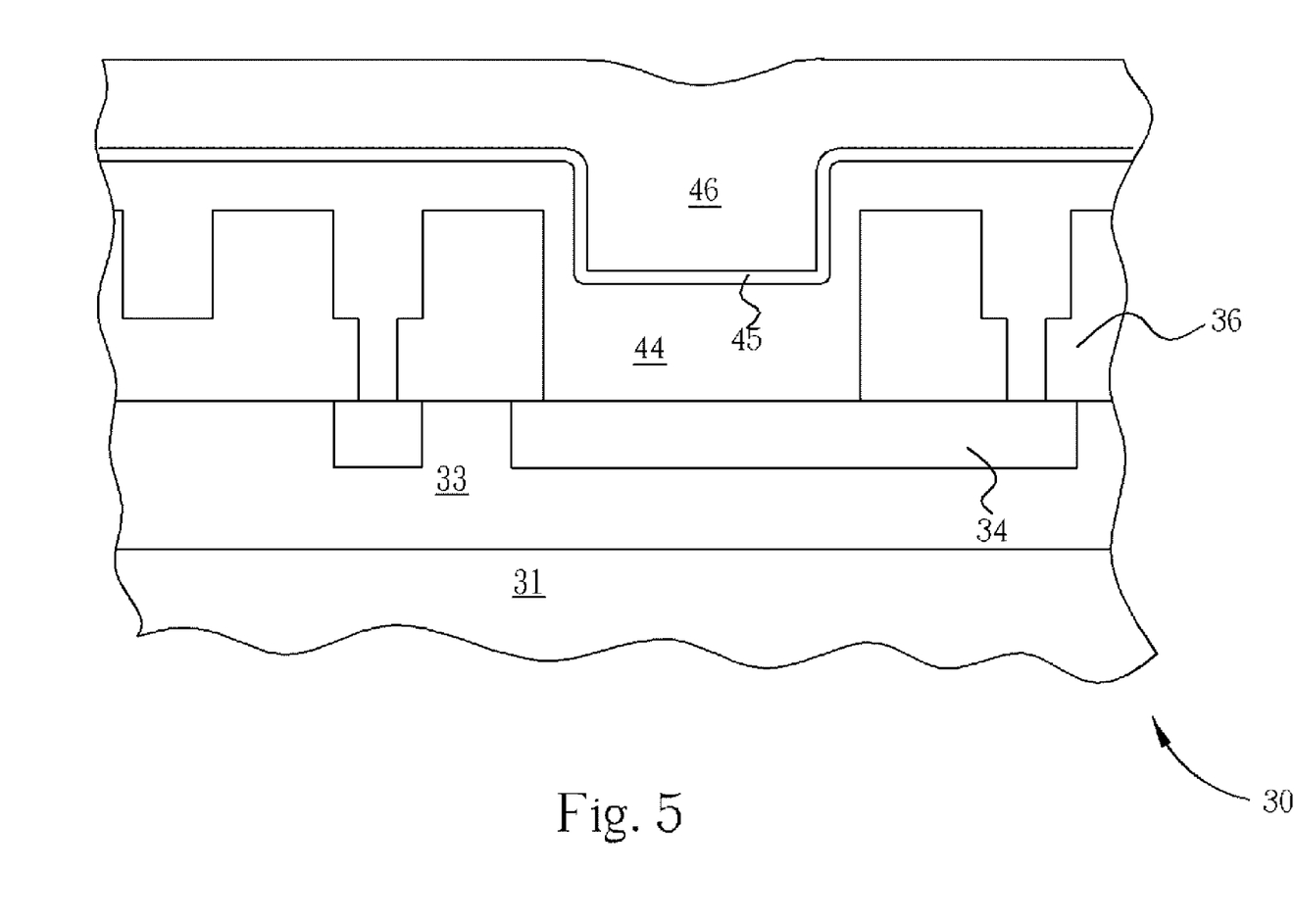

Next, an insulating layer 45 is formed on the first conductive layer 44, a second conductive layer 46 is formed on the surface of the insulating layer 45 and the capacitor opening 38, as shown in FIG. 5. In the present invention, the insulating layer 45 that can be comprised of insulating materials such as oxide-nitride-oxide (ONO), alumina ($Al_2O_3$), tantalum oxide ($Ta_2O_5$), or hafnium oxide ($HfO_2$) is the dielectric layer of the MIM capacitor, whereas the second conductive layer 46 disposed on the insulating layer 45 and filled the capacitor opening 38 is the upper plate of the MIM capacitor. In addition to the copper fabrication and integration process disclosed in the present invention, the first conductive layer 44 and the second conductive layer 46 can also be comprised of other conductive materials including polysilicon, aluminum, or aluminum-copper alloy.

Figure 6:
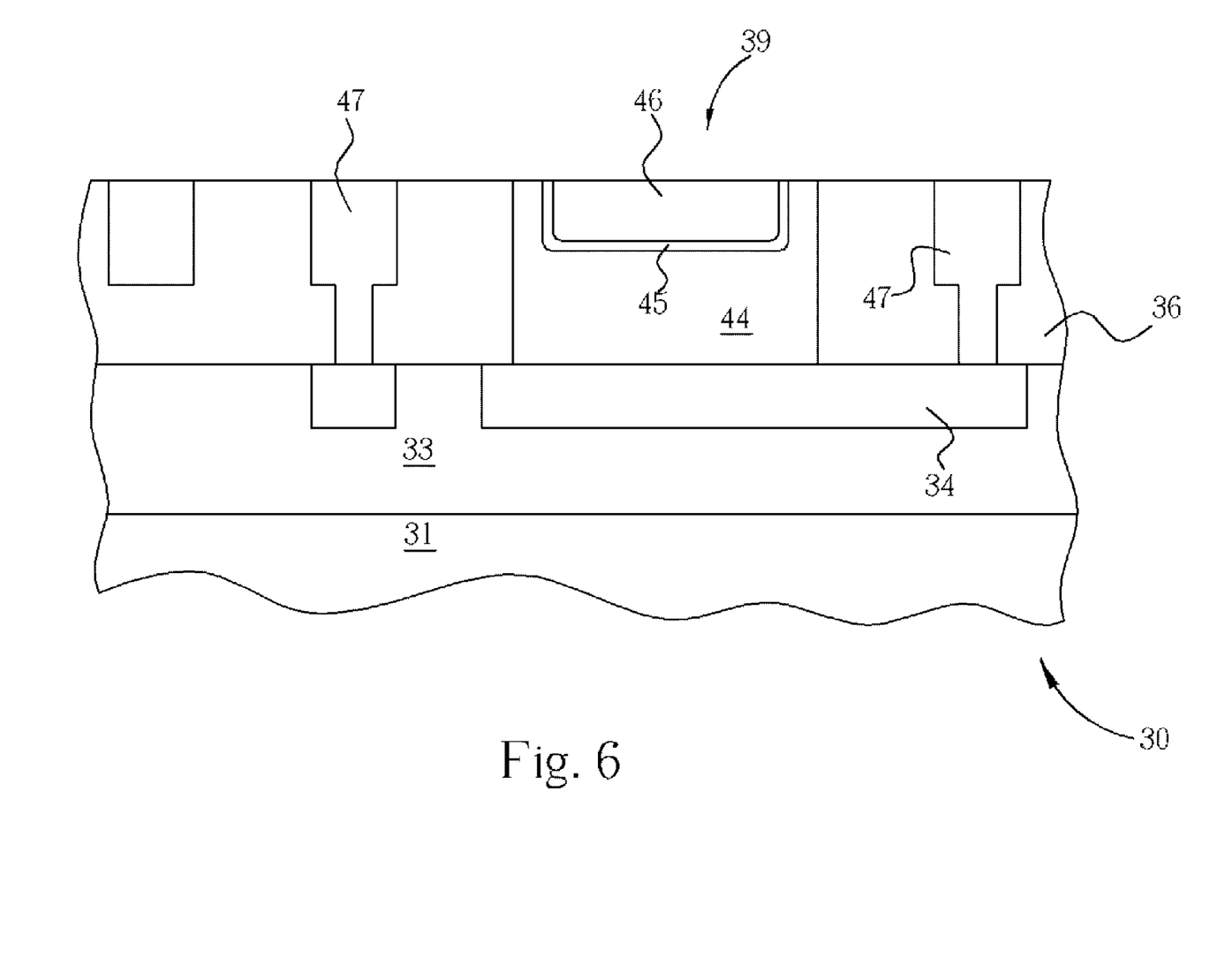

As shown in FIG. 6, a planarization process is performed to remove the second conductive layer 46 disposed on the surface of the dielectric layer 36, the insulating layer 45, and the first conductive layer 44 for forming a capacitor 39 in the capacitor opening 38 and a dual damascene conductor 47 in the dual damascene opening 40, in which the planarization process is a chemical mechanical polishing (CMP) process.

Figure 7:
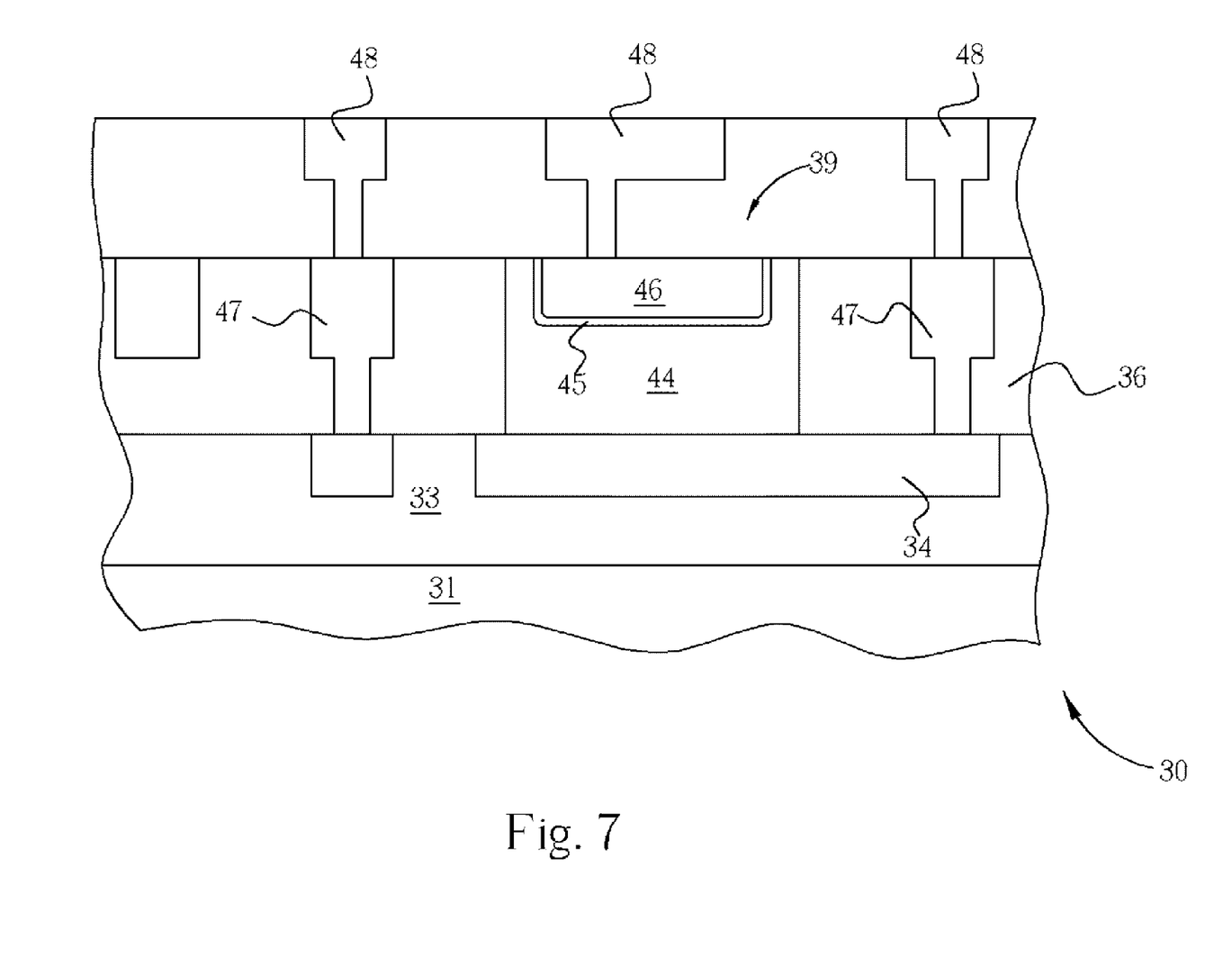

As shown in FIG. 7, after the capacitor 39 and the dual damascene conductors 47 are formed, additional dual damascene processes can be performed to electrically connect the upper plate of the capacitor 39 and the dual damascene conductors 47 to other dual damascene conductors 48 embedded in other layers of the semiconductor die. By utilizing the dual damascene conductors 48 to connect different devices with conducting wires in multiple layers of the semiconductor die, an internal metal wire interconnection network can be completed.

In contrast to the prior art method of fabricating a metal capacitor, the present invention provides a method that utilizes an integrated copper dual damascene process to fabricate an internal metal wire interconnection network and an MIM capacitor that is able to effectively reduce the contact resistance between the capacitor and the metal wires and the overall fabrication cost. Due to the utilization of low k materials and the fact that the resistance of copper metals is approximately 40% lower than the resistance of aluminum, the present invention provides a method that can not only greatly reduce the capacitance effect between metal wires, but also significantly improve the overall performance and the RC delay effect generated by electrical signal transmissions.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a capacitor comprising:
   providing a substrate having a dielectric layer thereon;
   forming at least one dual damascene opening and at least one capacitor opening within the dielectric layer;
   forming a first conductive layer for covering the dielectric layer surface and the sidewall and bottom of the capacitor opening, and completely filling the dual damascene opening;
   forming an insulating layer on the surface or the first conductive layer;
   forming a second conductive layer on the insulating layer surface and completely filling the capacitor opening; and
   performing a planarization process to remove the second conductive layer formed on the surface of the dielectric layer, the insulating layer, and the first conductive layer for forming a capacitor in the capacitor opening and a dual damascene conductor in the dual damascene opening.

2. The method of claim 1, wherein the first conductive layer and the second conductive layer are comprised of polysilicon, aluminum, aluminum-copper alloy, or copper.

3. The method of claim 1, wherein the dielectric layer comprises a metal interconnect for connecting to the capacitor.

4. The method of claim 1, wherein the dual damascene opening and the capacitor opening are formed by a trench-first dual damascene process.

5. The method of claim 1, wherein the dual damascene opening and the capacitor opening are formed by a via-first dual damascene process.

6. The method of claim 1, wherein the thickness of the first conductive layer covering the bottom of the capacitor opening is smaller than the thickness of the dielectric layer.

7. The method of claim 1, wherein the planarization process is a chemical mechanical polishing (CMP) process.

8. The method of claim 1, wherein the insulating layer comprises oxide-nitride-oxide (ONO), alumina ($Al_2O_3$), tantalum oxide ($Ta_2O_5$), or hafnium oxide ($HfO_2$).

9. A method for fabricating a metal-insulator-metal (MIM) capacitor comprising:
   providing a substrate having a dielectric layer thereon;
   forming at least one dual damascene opening and at least one MIM capacitor opening within the dielectric layer;
   forming a barrier layer on the dielectric layer, the sidewall and the bottom of the MIM capacitor opening, and the dual damascene opening;
   forming a seed layer on the barrier layer surface;
   forming a first copper layer on the seed layer, in which the thickness of the copper layer covering the bottom of the MIM capacitor is smaller than the thickness of the dielectric layer;
   forming an insulating layer on the surface of the first copper layer;
   forming a second copper layer on the insulating layer surface and completely filling the MIM capacitor opening; and
   performing a planarization process to remove the second copper layer formed on the dielectric layer, the insulating layer, and the first copper layer for forming an MIM capacitor in the MIM capacitor opening and a dual damascene conductor in the dual damascene opening.

10. The method of claim 9, wherein the dual damascene opening and the MIM capacitor opening are formed by a trench-first dual damascene process.

11. The method of claim 9, wherein the dual damascene opening and the MIM capacitor opening are formed by a via-first dual damascene process.

12. The method of claim 9, wherein the dielectric layer comprises a metal interconnect for connecting to the capacitor.

13. The method of claim 9, wherein the barrier layer and the seed layer are formed by a chemical vapor deposition (CVD) process.

14. The method of claim 9, wherein the barrier layer is comprised of tantalum (Ta), tantalum nitride (TaN), titanium (Ti), or titanium nitride (TiN).

15. The method of claim 9, wherein the first copper layer and the second copper layer are formed by an electroplating process.

16. The method of claim 9, wherein the planarization process is a chemical mechanical polishing (CMP) process.

17. The method of claim 9, wherein the insulating layer comprises oxide-nitride-oxide (ONO), alumina ($Al_2O_3$), tantalum oxide ($Ta_2O_5$), or hafnium oxide ($HfO_2$).

* * * * *